(12) United States Patent
Chiu et al.

(10) Patent No.: US 11,794,381 B2
(45) Date of Patent: Oct. 24, 2023

(54) LASER-DEBONDABLE COMPOSITION, LAMINATE THEREOF, AND LASER-DEBONDING METHOD

(71) Applicant: Daxin Materials Corporation, Taichung (TW)

(72) Inventors: Shih-Yun Chiu, Taichung (TW); Cheng-Wei Lee, Taichung (TW); Chi-Yen Lin, Taichung (TW)

(73) Assignee: DAXIN MATERIALS CORPORATION, Taichung (TW)

( * ) Notice: Subject to any disclaimer, the term of this patent is extended or adjusted under 35 U.S.C. 154(b) by 431 days.

(21) Appl. No.: 17/152,819

(22) Filed: Jan. 20, 2021

(65) Prior Publication Data

US 2021/0221032 A1 Jul. 22, 2021

(30) Foreign Application Priority Data

Jan. 21, 2020 (TW) .................. 109102238

(51) Int. Cl.
*B29C 33/68* (2006.01)
*H01L 21/78* (2006.01)
*C09J 7/40* (2018.01)
*B32B 7/06* (2019.01)
*B32B 27/00* (2006.01)
*H01L 27/06* (2006.01)
*C09J 7/30* (2018.01)

(52) U.S. Cl.
CPC ............... *B29C 33/68* (2013.01); *B32B 7/06* (2013.01); *B32B 27/00* (2013.01); *C09J 7/30* (2018.01); *C09J 7/40* (2018.01); *C09J 7/405* (2018.01); *H01L 21/78* (2013.01); *H01L 27/0688* (2013.01); *H01L 2221/68381* (2013.01)

(58) Field of Classification Search
None
See application file for complete search history.

(56) References Cited

U.S. PATENT DOCUMENTS

| 4,177,179 | A | * | 12/1979 | Kurihara | .............. | C09D 133/14 |
| | | | | | | 523/411 |
| 4,291,137 | A | * | 9/1981 | Nakate | ................... | C08G 12/42 |
| | | | | | | 525/110 |
| 4,293,475 | A | * | 10/1981 | Sidi | ........................ | C09D 17/00 |
| | | | | | | 526/273 |
| 4,294,939 | A | * | 10/1981 | Taniguchi | .......... | C09D 133/066 |
| | | | | | | 525/118 |

(Continued)

FOREIGN PATENT DOCUMENTS

| CN | 101256360 A | 9/2008 |
| JP | 2012062369 A | 3/2012 |

(Continued)

*Primary Examiner* — Kevin R Kruer
(74) *Attorney, Agent, or Firm* — Mark M. Friedman

(57) ABSTRACT

A laser-debondable composition includes an acrylic resin, a light-shielding material, an additive, and a solvent. Wherein, the acrylic resin includes at least one nitrogen-containing organic group selected from a group consisting of tertiary amino groups and secondary amino groups, an organic group having a cyclic ether group, and an organic group having a hydroxyl group, and the additive includes at least one adhesion promoter. The laser-debondable composition has excellent adhesion ability to a substrate, attachability, and solvent resistance.

10 Claims, 1 Drawing Sheet

(56) References Cited

U.S. PATENT DOCUMENTS

| | | | | |
|---|---|---|---|---|
| 5,064,719 | A * | 11/1991 | Den Hartog | C08K 5/5435<br>428/411.1 |
| 5,183,831 | A * | 2/1993 | Bielat | C08F 290/147<br>526/208 |
| 5,275,847 | A * | 1/1994 | Schwarte | B05D 7/16<br>427/407.1 |
| 5,364,910 | A * | 11/1994 | Takinishi | H01S 5/028<br>525/384 |
| 5,374,682 | A * | 12/1994 | Gouda | C09D 127/12<br>525/185 |
| 5,436,073 | A * | 7/1995 | Williams | B32B 27/10<br>428/512 |
| 5,494,970 | A * | 2/1996 | Serdiuk | C09D 133/14<br>525/207 |
| 5,686,532 | A * | 11/1997 | Bederke | C09D 163/00<br>525/227 |
| 5,990,192 | A * | 11/1999 | Gerlitz | C08G 18/675<br>522/98 |
| 6,358,568 | B1 * | 3/2002 | Schwarte | C09D 133/068<br>525/381 |
| 6,376,631 | B1 * | 4/2002 | Yeung | C08F 220/34<br>526/260 |
| 6,586,510 | B1 * | 7/2003 | Brown | C09J 133/08<br>428/354 |
| 6,878,776 | B1 * | 4/2005 | Pascault | C09D 7/68<br>525/181 |
| 7,510,769 | B2 * | 3/2009 | Hase | C08J 7/043<br>428/424.2 |
| 8,618,208 | B2 * | 12/2013 | Sugasaki | C08K 3/04<br>264/494 |
| 9,090,725 | B2 * | 7/2015 | Yoneda | C11D 3/3723 |
| 10,658,314 | B2 | 5/2020 | Yasuda et al. | |
| 2003/0176585 | A1 * | 9/2003 | Iyama | C09J 7/22<br>526/90 |
| 2005/0215655 | A1 * | 9/2005 | Bilodeau | C08F 283/006<br>522/7 |
| 2005/0256219 | A1 * | 11/2005 | Takase | C09D 4/00<br>522/7 |
| 2006/0052571 | A1 * | 3/2006 | Heischkel | C09D 175/16<br>528/44 |
| 2009/0076183 | A1 * | 3/2009 | Chiao | C09D 167/07<br>522/101 |
| 2009/0098304 | A1 * | 4/2009 | Stone | C09D 133/14<br>427/520 |
| 2010/0240196 | A1 * | 9/2010 | Saito | H01L 24/83<br>438/464 |
| 2011/0086180 | A1 * | 4/2011 | Tielemans | C08G 18/758<br>523/403 |
| 2011/0166286 | A1 * | 7/2011 | Moens | C09D 133/06<br>524/513 |
| 2011/0172328 | A1 * | 7/2011 | Niggemann | C09D 5/033<br>523/351 |
| 2011/0245409 | A1 * | 10/2011 | Hood | C09D 133/066<br>526/264 |
| 2012/0214916 | A1 * | 8/2012 | Dube | C09D 133/14<br>524/556 |
| 2012/0300299 | A1 * | 11/2012 | Yasui | B32B 27/08<br>427/299 |
| 2013/0034729 | A1 * | 2/2013 | Taya | C09J 7/24<br>428/354 |
| 2013/0211028 | A1 * | 8/2013 | Shinike | C09J 11/04<br>526/307.5 |
| 2015/0005408 | A1 * | 1/2015 | Lindekens | C07C 69/54<br>522/170 |
| 2015/0247055 | A1 * | 9/2015 | Takahashi | C09D 11/328<br>522/39 |
| 2016/0009962 | A1 * | 1/2016 | Yamada | C08F 220/1804<br>428/41.5 |
| 2016/0017184 | A1 * | 1/2016 | Moore | C09J 11/08<br>156/247 |
| 2016/0185089 | A1 | 6/2016 | Yoneyama et al. | |
| 2016/0244631 | A1 * | 8/2016 | Paar | C08G 59/184 |
| 2017/0198170 | A1 * | 7/2017 | Clapper | G02B 5/00 |
| 2018/0355231 | A1 * | 12/2018 | Litke | C09J 179/08 |
| 2019/0144717 | A1 * | 5/2019 | Schuh | C08G 59/4014<br>156/330 |
| 2020/0056041 | A1 * | 2/2020 | Yu | C08G 77/20 |
| 2020/0282605 | A1 | 9/2020 | Sasaki et al. | |
| 2020/0361192 | A1 * | 11/2020 | Choi | B32B 38/145 |
| 2021/0062051 | A1 * | 3/2021 | Verstraeten | C09D 133/08 |
| 2021/0179767 | A1 * | 6/2021 | Cappelle | C08G 18/8125 |
| 2021/0221032 | A1 * | 7/2021 | Chiu | H01L 27/0688 |
| 2022/0089915 | A1 * | 3/2022 | Yang | C08F 220/1804 |
| 2022/0213353 | A1 * | 7/2022 | Morita | H10K 50/844 |
| 2022/0251425 | A1 * | 8/2022 | Yoo | B32B 17/06 |
| 2022/0306785 | A1 * | 9/2022 | Higashionna | C08J 5/18 |
| 2023/0103371 | A1 * | 4/2023 | Ke | G03F 7/11<br>430/271.1 |

FOREIGN PATENT DOCUMENTS

| | | |
|---|---|---|
| JP | 2013200431 A | 10/2013 |
| JP | 2014189563 A | 10/2014 |
| JP | 2015021065 A | 2/2015 |
| JP | 2018064092 A | 4/2018 |
| JP | 2018093021 A | 6/2018 |
| KR | 20160039188 A | 4/2016 |
| TW | 200842162 A | 11/2008 |
| TW | 201819141 A | 6/2018 |
| TW | 201920561 A | 6/2019 |
| TW | 201930520 A | 8/2019 |
| WO | 2015016063 A1 | 2/2015 |
| WO | 2018194169 A1 | 10/2018 |

* cited by examiner

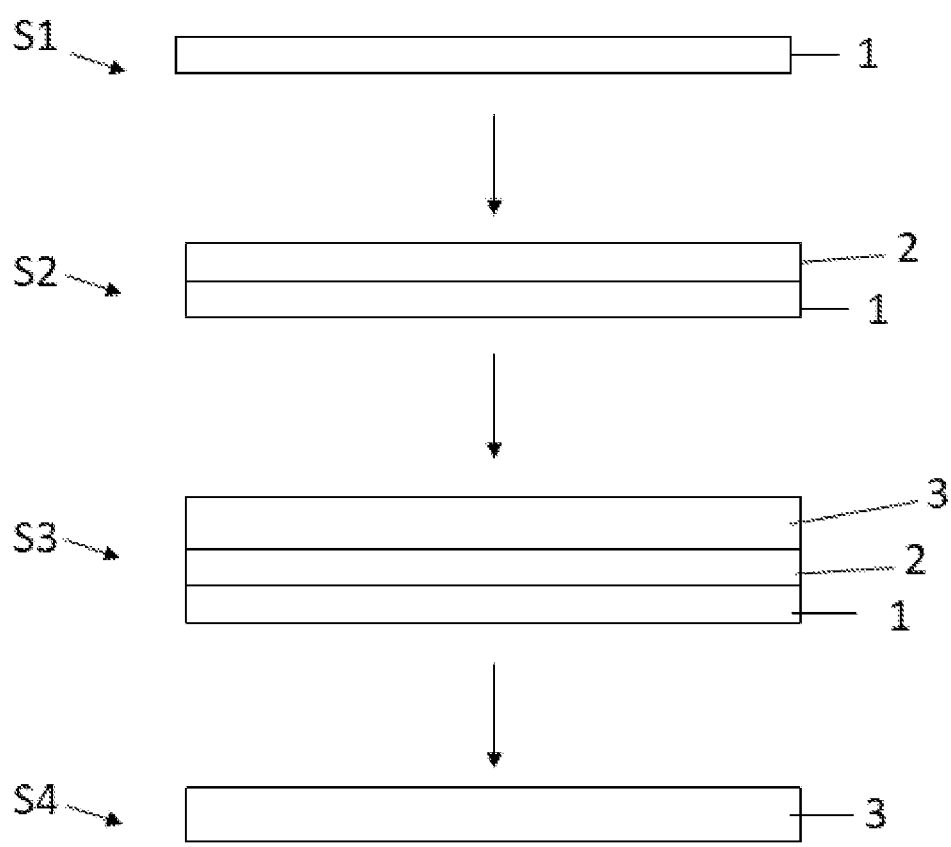

LASER-DEBONDABLE COMPOSITION, LAMINATE THEREOF, AND LASER-DEBONDING METHOD

FIELD OF INVENTION

The present disclosure relates to a composition, and more particularly, to a laser-debondable composition, a laminate formed by the composition, and a laser-debonding method using the composition or the laminate.

BACKGROUND OF INVENTION

In recent years, in order to meet market requirements for faster, cheaper, and smaller electronic products, fan-out wafer-level packaging (FOWLP), 2.5 dimensional integrated circuit (2.5D IC) technology, and 3 dimensional integrated circuit (3D IC) technology have been mainstreams in semiconductor packaging. In order to prevent warpage and brittleness of thin silicon wafers from affecting subsequent processes, use of carriers has become an indispensable step. However, under requirements for smaller products, the carriers must eventually be removed, so packaging techniques are often accompanied by use of releasing layers. Therefore, a market for the releasing layers is created. Although laser-debonding technique has more expensive equipment requirements, it has an advantage of debonding the carriers off devices rapidly under low temperatures, which allows the laser-debonding technique to be a mainstream in debonding techniques nowadays.

In order to enable different processes on the releasing layers, such as fabricating redistribution layers, die bonding, molding, wafer grinding, and wafer flipping, and in order to meet different process requirements, materials for forming the releasing layers require an excellent adhesion ability to a substrate and an excellent solvent resistance. However, in today's technology, materials containing light-shielding materials, due to increase of discontinuous surfaces in the materials, often cause a poor solvent resistance.

Therefore, regarding the issues above, the present disclosure provides a laser-debondable composition having excellent adhesion ability to the substrate, attachability, and solvent resistance.

SUMMARY OF INVENTION

An objective of the present disclosure is to provide a laser-debondable composition. The laser-debondable composition includes an acrylic resin, a light-shielding material, an additive, and a solvent. Wherein, the acrylic resin includes at least one nitrogen-containing organic group selected from a group consisting of tertiary amino groups and secondary amino groups, an organic group having a cyclic ether group, and an organic group having a hydroxyl group, and the additive includes at least one adhesion promoter.

In an embodiment of the present disclosure, an acid value of the acrylic resin is less than 4 mg/g.

In an embodiment of the present disclosure, the adhesion promoter includes at least one siloxane compound or silane compound having a functional group selected from a group consisting of vinyl groups, epoxy groups, and isocyanate groups.

In an embodiment of the present disclosure, the at least one nitrogen-containing organic group selected from the group consisting of tertiary amino groups and secondary amino groups may be, but is not limited to, at least one selected from a group consisting of 2-(hydrocarbyl)amino hydrocarbyl ester groups, dihydrocarbyl amino hydrocarbyl ester groups, urethane groups, pyridine groups, piperazine groups, and morpholine groups.

In an embodiment of the present disclosure, the acrylic resin includes at least two cyclic ether groups having rings with different carbon numbers.

In an embodiment of the present disclosure, the cyclic ether group is an oxetanyl group, a glycidyl group, or a combination thereof.

In an embodiment of the present disclosure, the light-shielding material is a material allowing the laser-debondable composition to absorb or block at least one wave band of visible light, infrared light, or ultraviolet light.

Another objective of the present disclosure is to provide a laminate. The laminate includes a support material and a film formed on the support material using the laser-debondable composition mentioned above.

Another objective of the present disclosure is to provide a laser-debonding method, which includes following steps: step S1: providing a support material; step S2: coating the laser-debondable composition mentioned above onto the support material and curing the laser-debondable composition to form a film; step S3: forming a processing member on the film; and step S4: using laser to remove the support material.

In an embodiment of the present disclosure, the processing member is a die or a redistribution layer.

DESCRIPTION OF DRAWINGS

FIG. 1 is a process diagram of a laser-debonding method according to an embodiment of the present disclosure.

DETAILED DESCRIPTION OF PREFERRED EMBODIMENTS

Before describing at least one embodiment of the present disclosure in detail, it should be understood that the present disclosure is not necessarily limited to its application in the details illustrated in the following examples, for example, the number of embodiments, specific mixing ratio used thereof, etc. The present disclosure can be implemented or realized in other embodiments or in various ways.

[Laser-Debondable Composition]

The present disclosure provides a laser-debondable composition having excellent adhesion ability to a substrate, attachability, transferability, and solvent resistance. The laser-debondable composition includes an acrylic resin, a light-shielding material, an additive, and a solvent. Each component will be described in detail in the following.

[Acrylic Resin]

In order to realize the above beneficial effects, in an embodiment of the present disclosure, the acrylic resin at least includes at least one nitrogen-containing organic group selected from a group consisting of tertiary amino groups and secondary amino groups, an organic group having a cyclic ether group, and an organic group having a hydroxyl group.

The at least one nitrogen-containing organic group selected from the group consisting of tertiary amino groups and secondary amino groups may be, but is not limited to, pyridine groups, piperazine groups, morpholine groups, 2-(hydrocarbyl)amino hydrocarbyl ester groups, dihydrocarbyl amino hydrocarbyl ester groups, urethane groups, etc., wherein, each —$CH_2$— in hydrocarbon groups is optionally replaced with one of —NH—, —O—, or —S—, with proviso that when at least two of —CH$_2$— are replaced, substituents, that is, —NH—, —O—, or —S—, are not bonded to each other directly. Specifically, at least one monomer selected from the group consisting of tertiary amino groups and secondary amino groups may be used for synthesis, such as acryloyl morpholine, methacryloyl morpholine, 4-vinylpyridine, 2-vinylpyridine, 5-ethyl-2-vinylpyridine, N-acryloylpiperazine, 2-(tert-butylamino)ethyl methacrylate, dimethylaminoethyl acrylate, dimethylaminoethyl methacrylate, diethylaminoethyl acrylate, diethylaminoethyl methacrylate, diethylaminopropyl acrylate, diethylaminopropyl methacrylate, urethane acrylate, urethane methacrylate, etc.

The organic group having the cyclic ether group may be, but is not limited to, an oxetanyl group, a glycidyl group, etc. Specifically, a monomer having the cyclic ether group may be used for synthesis, such as glycidyl (meth)acrylate, allyl glycidyl ether, α-ethyl acrylic acid glycidyl, crotonyl glycidyl ether, (iso)crotonic acid glycidyl ether, (3-ethyloxetan-3-yl)methyl methacrylate, (3-ethyloxetan-3-yl)methyl acrylate, etc.

The organic group having the hydroxyl group in the acrylic resin may be obtained using a monomer having the hydroxyl group, and the monomer having the hydroxyl group includes, but is not limited to, hydroxyalkyl (meth)acrylates. Specific examples include: hydroxyethyl methacrylate, hydroxyethyl acrylate, hydroxypropyl methacrylate, hydroxypropyl acrylate, hydroxybutyl methacrylate, hydroxybutyl acrylate, hydroxyhexyl methacrylate, hydroxyhexyl acrylate, etc. The organic group having the hydroxyl group in the acrylic resin may also be synthesized by graft polymerization. For example, having a main chain of a resin to have carboxyl groups first to form a resin with carboxyl groups, then using epoxy compounds for graft polymerization to allow the carboxyl groups to react with epoxy groups and create hydroxyl groups. Specifically, the resin with the carboxyl groups is not specifically limited, and in general, it is usually obtained by polymerizing polymerizable monomers containing carboxyl groups, and polyesters having carboxyl groups polymerized by polyacids and polyols can also be used as the resin with the carboxyl groups. The polymerizable monomers containing carboxyl groups include, but are not limited to, (meth)acrylic acid, maleic acid, maleic anhydride, crotonic acid, 2-methylenebutanedioic acid, fumaric acid, 2-(meth)acryloxyethyl succinic acid, 2-acryloyloxyethyl adipic acid, 2-(meth)acryloxyethyl phthalic acid, 2-(meth)acryloxyethyl hexahydrophthalic acid, 2-(meth)acryloxyethyl maleic acid, 2-(meth)acryloxypropyl succinic acid, 2-acryloxypropyl adipic acid, 2-(meth)acryloxypropyl hydrophthalic acid, 2-(meth)acryloxypropyl phthalic acid, 2-(meth)acryloxypropyl maleic acid, 2-(meth)acryloxybutyl succinic acid, 2-acryloxybutyl adipic acid, 2-(meth)acryloxybutyl hydrophthalic acid, 2-(meth)acryloxybutyl phthalic acid, 2-(meth)acryloxybutyl maleic acid, etc. The epoxy compounds for graft polymerization may be any compounds having an epoxy group, such as ethylene oxide, propylene oxide, glycidyl (meth)acrylate, allyl glycidyl ether, α-ethyl acrylic acid glycidyl, crotonyl glycidyl ether, (iso)crotonic acid glycidyl ether, etc., and are not limited to these. In addition, the hydroxyl groups can also be obtained by reducing aldehydes, ketones, or carboxylic acids.

Preferably, the acrylic resin of the present disclosure includes at least two cyclic ether groups having rings with different carbon numbers, and more preferably, the at least two cyclic ether groups having rings with different carbon numbers are a combination of the oxetanyl group and the glycidyl group.

Proportions of the at least one nitrogen-containing organic group selected from the group consisting of tertiary amino groups and secondary amino groups, the organic group having the cyclic ether group, and the organic group having the hydroxyl group disclosed in the embodiment of the present disclosure are not specifically limited, as long as they do not affect characteristics such as adhesion ability and solvent resistance mentioned in the present disclosure. In particular, taking an overall solid content of the acrylic resin as 100% by weight, monomers having the at least one nitrogen-containing organic group selected from the group consisting of tertiary amino groups and secondary amino groups range from 1 to 50% by weight, preferably 3 to 35% by weight, and more preferably 5 to 20% by weight; monomers having the cyclic ether group range from 5 to 65% by weight, preferably 10 to 50% by weight, and more preferably 15 to 35% by weight; and monomers having the hydroxyl group range from 1 to 75% by weight, preferably 3 to 60% by weight, and more preferably 5 to 45% by weight.

Further, in the acrylic resin, a mass ratio of the organic group having the cyclic ether group to the at least one nitrogen-containing organic group ranges from 1:0.015 to 1:10, preferably 1:0.05 to 1:3.5, and more preferably 1:0.17 to 1:0.67; a mass ratio of the organic group having the cyclic ether group to the organic group having the hydroxyl group ranges from 1:0.015 to 1:25, preferably 1:0.05 to 1:6, and more preferably 1:0.17 to 1:2.3; and a mass ratio of the at least one nitrogen-containing organic group to the organic group having the hydroxyl group ranges from 1:0.02 to 1:60, preferably 1:0.1 to 1:20, and more preferably 1:1 to 1:6.

The acrylic resin of the present disclosure may further include other functional groups, such as aromatic groups, alicyclic groups, siloxy groups, carboxyl groups, etc., and is not limited to these, as long as they do not affect characteristics mentioned in the present disclosure. In particular, monomers having an aromatic group may be styrene, 2-phenylphenoxyethyl acrylate, etc., monomers having an alicyclic group may be tricyclo[5.2.1.02,6]decan-8-ol methacrylate, etc., monomers having a siloxy group may be methacryloxy propyl trimethoxyl silane, etc., and monomers having a carboxyl group may be methacrylic acid, acrylic acid, etc. A proportion of the other functional groups is not specifically limited, as long as it does not affect the characteristics such as adhesion ability and solvent resistance mentioned in the present disclosure. In particular, taking the overall solid content of the acrylic resin as 100% by weight, monomers having the other functional groups range from 0 to 80% by weight, preferably 0 to 60% by weight, and more preferably 20 to 50% by weight.

A weight-average molecular weight of the acrylic resin is greater than 60,000, preferably ranges from 70,000 to 140,000, and more preferably ranges from 80,000 to 100,000 for realizing excellent adhesion ability and solvent resistance. In an overall solid content of the laser-debondable composition of the present disclosure, a proportion of the acrylic resin is not specifically limited, as long as it does not affect the characteristics such as adhesion ability and solvent resistance mentioned in the present disclosure. In particular, the acrylic resin accounts for 5 to 70% by weight of the overall solid content of the laser-debondable composition, preferably 7 to 55% by weight, and more preferably 10 to 40% by weight.

Preferably, an acid value of the acrylic resin is less than 4 mg/g for realizing excellent adhesion ability and solvent resistance of the present disclosure.

[Light-Shielding Material]

The light-shielding material of the present disclosure is a material allowing the laser-debondable composition to absorb or block at least one wave band of visible light, infrared light, or ultraviolet light. With addition of the light-shielding material, laser corresponding to a specific wave band thereof can separate a film formed of the laser-debondable composition from a support material. Materials as the light-shielding material can be listed as follows, which include, but are not limited to, carbon black, titanium black, titanium oxide, iron oxide, titanium nitride, silica fume, organic pigments, inorganic pigments, dyes, or a combination thereof.

Preferably, the light-shielding material does not contain metal ions.

A proportion of the light-shielding material is not specifically limited, as long as it does not affect the characteristics such as adhesion ability and solvent resistance mentioned in the present disclosure. In particular, the light-shielding material accounts for 20 to 90% by weight of the overall solid content of the laser-debondable composition, preferably 35 to 85% by weight, and more preferably 50 to 70% by weight. In addition, the acrylic resin of the present disclosure allows the proportion of the light-shielding material added to be greater than 50% by weight, which can reduce an energy required for laser-debonding.

[Additive]

The additive may be an adhesion promoter, a cross-linking agent, etc. The adhesion promoter may be a silane, a siloxane, or a surfactant. Preferably, the adhesion promoter is a siloxane compound or silane compound having a vinyl group, an epoxy group, an amino group, an anhydride, a thiol group, or an isocyanate group, and more preferably, the adhesion promoter is the siloxane compound or silane compound having the vinyl group. The cross-linking agent is preferably a thermal cross-linking agent, which may be blocked isocyanate group or unblocked isocyanate group-containing compounds, alkenyl ether group-containing compounds such as divinyl ether, hydrocarbyloxy hydrocarbon group-containing compounds, dianhydride group-containing compounds, dithiol group-containing compounds, epoxy resins, melamine compounds, phenolic compounds, etc. The additive may be one or a combination of two or more.

Preferably, the additive at least includes one adhesion promoter, and more preferably, the additive at least includes one adhesion promoter and one cross-linking agent.

In particular, the adhesion promoter may be [3-(2,3-epoxypropoxy)-propyl]-trimethoxysilane, 3-isocyanatopropyltrimethoxysilane, 3-methacryloxypropyltrimethoxysilane, etc., and the thermal cross-linking agent may be hexamethylol melamine, hexamethoxy methyl melamine, trimethylol phenol, 3,3',5,5'-tetrakis(MethoxyMethyl)-[1,1'-biphenyl]-4,4'-diol, novolac epoxy resin, etc.

A proportion of the additive is not specifically limited, as long as it does not affect the characteristics such as adhesion ability and solvent resistance mentioned in the present disclosure. In particular, the additive accounts for 5 to 35% by weight of the overall solid content of the laser-debondable composition, preferably 7 to 25% by weight, and more preferably 10 to 15% by weight.

[Solvent]

The solvent may be amides, cycloamides, esters, ethers, alcohols, or a mixed solvent of the above solvents in any ratio. For example, the solvent includes, but is not limited to, 1-methyl-2-pyrrolidone, N,N-dimethylformamide, N,N-dimethylacetamide, N-methylcaprolactam, dimethyl sulfide, tetramethylurea, hexamethyl phosphoramide, γ-butyrolactone, pyridine, methanol, ethanol, isopropanol, n-butanol, cyclohexanol, ethylene glycol, ethylene glycol methyl ether, ethylene glycol monoethyl ether, ethyl glycol monobutyl ether, ethylene glycol dimethyl ether, ethylene glycol diethyl ether, diethyl ether, acetone, methyl ethyl ketone, cyclohexanone, methyl acetate, ethyl acetate, tetrahydrofuran, dichloromethane, chloroform, 1,2-dichloroethane, benzene, toluene, xylene, n-hexane, n-heptane, n-octane, etc. A proportion of the solvent is not specifically limited, as long as it does not affect the characteristics such as adhesion ability and solvent resistance mentioned in the present disclosure and can be coated to form a film.

[Composite Film]

The laser-debondable composition of the present disclosure may be also used to form a transferable composite film. The composite film includes a debondable support film and a temporary adhesive film formed using the laser-debondable composition of the present disclosure. Wherein, the temporary adhesive film is disposed on one surface of the debondable support film. Specifically, the composite film can be obtained by coating the laser-debondable composition onto a surface of the debondable support film and heating to remove a part or all of the solvent. The temporary adhesive film of the composite film can be stripped off.

Materials as the debondable support film may include, but are not limited to, synthetic resin films, such as polyethylene terephthalate (PET), polyethylene, polypropylene, polycarbonate, and polyvinyl chloride, having a thickness ranging from 15 to 200 μm. A protective film may also cover a surface of the temporary adhesive film away from the debondable support film.

In addition, coating methods may include, but is not limited to, spin coating, slit coating, wire bar coating, screen printing, etc.

[Laminate]

The present disclosure further provides a laminate. The laminate of the present disclosure includes a support material and a temporary adhesive film formed using the laser-debondable composition mentioned above. Specifically, the laminate can be obtained by coating the laser-debondable composition onto a surface of the support material and heating to remove a part or all of the solvent; or the laminate may be formed by transferring the composite film onto the surface of the support material.

The support material of the present disclosure is not limited, as long as it is a material can be penetrated by the laser. For example, the support material may be glass, silicon wafers, etc.

A coating method using the laser-debondable composition of the present disclosure to form a film on the support material is not limited, as long as it can be used to form the film on the support material, such as spin coating, blade coating, etc.

After coating, the film is cured by heating on a hotplate at a pre-bake temperature ranging from 40° C. to 100° C. for 5 to 20 minutes to remove the solvent and then heating at a temperature ranging from 200° C. to 300° C. for 30 to 60 minutes.

[Laser-Debonding Method]

The present disclosure further provides a laser-debonding method, which includes following steps:

step S1: providing the support material 1;

step S2: coating the laser-debondable composition mentioned above onto the support material and curing the laser-debondable composition to form the film 2;

step S3: forming a processing component 3 on the film 2; and step S4: using laser to remove the support material 1.

Specifically, the steps S1 and S2 are a providing step of the above laminate. Further, the step S2 may also be completed by transfer printing, that is, transferring the temporary adhesive film formed using the laser-debondable composition mentioned above onto the surface of the support material.

Specifically, the processing member mentioned in the step S3 may be a die (KGD) or a redistribution layer (RDL). Further, if the processing member is the die (KGD), then the step S3 will further include molding, and if the processing member is the redistribution layer (RDL), then the step S3 will further include steps of die bonding and molding.

Specifically, species of the laser used in the step S4 is not limited and may include solid state laser such as YAG laser, ruby laser, YVO4 laser, and fiber laser, liquid state laser such as dye laser, gas laser such as CO2 laser, excimer laser, Ar laser, and He—Ne laser, semiconductor laser, diode pump solid state laser (DPSSL), free electron laser, etc.

Further, the step S4 may also include a cleaning step to remove residues of the laser-debondable composition after using the laser to remove the support material 1 and may also include a step of solder printing. Specifically, the cleaning step may be dry etching that using plasma, wet etching that using chemicals, etc.

According to different application fields thereof, in addition to an application in the field of semiconductors, any substrate, material, or processing member requiring to undergo one or more processes by the laminate of the present disclosure and at last to be separated from the laminate by laser, belongs to the scope of the laser-debonding method of the present disclosure.

EXAMPLES

Synthesis of an Acrylic Resin:

a thermometer, a burette, a nitrogen gas inlet, and a stirring rod device are set up in a one liter of reactor. First, 150 grams of propylene glycol monomethyl ether acetate (PGMEA) is added into the reactor, stirred at 200 rpm, and heated to 85° C., then monomers having different mass ratios and 0.005 mol of azobisisobutyronitrile are mixed with 150 grams of PGMEA and added into the reactor by drops, keeping the temperature and continuing stirring for 4 hours, and then when reducing the temperature to the room temperature, the reaction is completed to obtain a resin solution having a solid content of 40%.

Preparation of a Laser-Debondable Composition:

first, an adhesion promoter and a cross-linking agent are added to a mixed solvent having N,N-diethylformamide of 20% and propylene glycol monomethyl ether acetate (PGMEA) of 80%, after mixing well, the resin is added and mixed well again, and finally a light-shielding material (PK260, purchased from Daxin Materials Corp.) is added and the solution is stirred for 1 hour to obtain a composition having a solid content of 20%.

Fabrication of a Laminate:

compositions having proportions shown in tables 1 to 3 are spin coated onto a glass support material in a rate that can form a film having a thickness of 1.3 μm. After pre-baking at 50° C. for 5 minutes and at 90° C. for 5 minutes to remove the solvent and dry a surface of the film, the film is cured at 230° C. for 30 minutes to form the laminate.

Test of solvent resistance: soaking the laminate into a photoresist remover (AT7880P, purchased from APPLI-CHEM TECHNOLOGY CORP.) at 80° C., and performing a cross cut adhesion test following ASTM D3359 protocol to determine peeling situations. AT7880P is composed of dimethyl sulfide, ethanolamine, and tetramethylammonium hydroxide. (⊚ represents a result of the cross cut adhesion test is 5B after a soaking time is greater than 10 minutes; ○ represents the result of the cross cut adhesion test is 5B after soaking for 10 minutes; Δ represents the result of the cross cut adhesion test is 5B after soaking for 5 minutes; and X represents the result of the cross cut adhesion test cannot be 5B no matter what the soaking time is.)

Test of adhesion ability: performing a pull-off test using a tensile testing machine. First, a frame glue (723K1, purchased from AUO) is quantitatively spotted on a coated test piece, and a glass substrate is attached thereon. A photo curing process is performed by irradiating with a UV lamp having a wavelength of 355 nm for 169 seconds, and then the coated test piece is thermal cured at 120° C. for 1 hour. At last, the pull-off test is performed, and a tensile stress thereof is a force needed to strip a coating layer off divided by an area of the frame glue. A tensile stress of a pair of glass substrates attached to each other is taken as a standard, which defines as 2 N/mm$^2$. Values of the test of adhesion ability for samples can be obtained by standardizing all tensile stresses of the samples.

Test of laser-debonding ability: the laser-debonding ability is tested using laser having a wavelength of 355 nm with an energy of 1 W or greater than 1 W to scan continuously, and after that, if the tested material can be torn up with an adhesive paper (a protect film), then it is a laser-debondable material.

Following examples are all laser-debondable.

Components of the Resin:

OXMA: (3-ethyloxetan-3-yl)methyl methacrylate; GMA: glycidyl methacylate; ACMO: acryloyl morpholine; HEMA: 2-hydroxyethyl methacrylate; FA513M: tricyclo[5.2.1.02,6] decan-8-ol methacrylate; EM2105: 2-phenylphenoxyethyl acrylate; EM50: styrene; A174: methacryloxy propyl trimethoxyl silane; DMAEMA: dimethylaminoethyl acrylate.

Components of the Additive:

X-12-1050: a silicone polymer having two or more of acrylic functional groups (purchased from Shin-Etsu Chemical Co.); Alink: 3-isocyanatopropyltrimethoxysilane; AD124: [3-(2,3-epoxypropoxy)-propyl]-trimethoxysilane; N740: novolac epoxy resin; TMOM-BP: 3,3',5,5'-tetrakis (MethoxyMethyl)-[1,1'-biphenyl]-4,4'-diol; HMMM: hexamethoxy methyl melamine.

TABLE 1 examples 1 to 6.

| solid content | | example 1 | example 2 | example 3 | example 4 | example 5 | example 6 |
|---|---|---|---|---|---|---|---|
| components of resin (wt %) | OXMA | 15 | 30 | 30 | 15 | 25 | — |
| | GMA | — | — | — | — | — | 35 |
| | ACMO | 10 | 10 | 10 | 20 | 5 | 20 |
| | HEMA | 35 | 40 | 40 | 20 | 30 | 45 |
| | FA513M | 15 | — | — | 15 | 25 | — |
| | EM2105 | 25 | — | — | 25 | 15 | — |
| | EM50 | — | 20 | 20 | — | — | — |
| | A174 | — | — | — | 5 | — | — |
| resin (wt %) | | 13 | 23 | 42 | 23 | 29 | 23 |
| light-shielding material (wt %) | | 73 | 63 | 44 | 63 | 57 | 63 |
| additive (wt %) | | 14 | 14 | 14 | 14 | 14 | 14 |
| components of additive (wt %) | X-12-1050 | 27 | 27 | 27 | 27 | 27 | 27 |
| | Alink | 40 | 40 | 40 | 40 | 40 | 40 |
| | AD124 | — | — | — | — | — | — |
| | N740 | — | — | — | — | — | — |
| | TMOM-BP | — | — | — | — | — | — |
| | HMMM | 33 | 33 | 33 | 33 | 33 | 33 |
| solvent resistance | | ◎ | ◎ | ◎ | ◎ | ◎ | ◎ |
| adhesion ability | | 0.589 | 0.618 | 1.087 | 0.528 | 0.929 | 0.589 |

TABLE 2 examples 7 to 13.

| solid content | | example 7 | example 8 | example 9 | example 10 | example 11 | example 12 | example 13 |
|---|---|---|---|---|---|---|---|---|
| components of resin (wt %) | OXMA | 17 | 35 | 35 | 25 | 25 | 25 | 15 |
| | GMA | 17 | — | — | — | — | — | — |
| | ACMO | 21 | 20 | 20 | 5 | 5 | 5 | 20 |
| | HEMA | 45 | 45 | 45 | 30 | 30 | 30 | 25 |
| | FA513M | — | — | — | 25 | 25 | 25 | 15 |
| | EM2105 | — | — | — | 15 | 15 | 15 | 25 |
| | EM50 | — | — | — | — | — | — | — |
| | A174 | — | — | — | — | — | — | — |
| resin (wt %) | | 23 | 23 | 7 | 23 | 24 | 23 | 23 |
| light-shielding material (wt %) | | 63 | 63 | 79 | 63 | 66 | 63 | 63 |
| additive (wt %) | | 14 | 14 | 14 | 14 | 10 | 14 | 14 |
| components of additive (wt %) | X-12-1050 | 27 | 27 | 27 | 27 | — | 27 | 27 |
| | Alink | 40 | 40 | 40 | — | 55 | — | 40 |
| | AD124 | — | — | — | 40 | — | 40 | — |
| | N740 | — | — | — | — | — | — | 33 |
| | TMOM-BP | — | — | — | — | — | 33 | — |
| | HMMM | 33 | 33 | 33 | 33 | 45 | — | — |
| solvent resistance | | ◎ | ◎ | ◎ | ◎ | ◎ | ◎ | ○ |
| adhesion ability | | 1.103 | 0.696 | 0.862 | 0.536 | 0.503 | 0.803 | 0.608 |

TABLE 3 examples 14 to 16 & comparative examples 1 to 4.

| solid content | | example 14 | example 15 | example 16 | comparative example 1 | comparative example 2 | comparative example 3 | comparative example 4 |
|---|---|---|---|---|---|---|---|---|
| components of resin (wt %) | OXMA | 25 | 30 | — | — | 20 | — | 58 |
| | GMA | — | — | 15 | — | — | — | — |
| | ACMO | 5 | 5 | 10 | — | — | 38 | 42 |
| | HEMA | 30 | 5 | 25 | — | 35 | 62 | — |
| | FA513M | 25 | 30 | 25 | — | 20 | — | — |
| | EM2105 | 15 | 30 | 25 | — | 25 | — | — |
| | EM50 | — | — | — | — | — | — | — |
| | A174 | — | — | — | — | — | — | — |
| resin (wt %) | | 23 | 31 | 31 | 0 | 13 | 23 | 23 |
| light-shielding material wt % | | 63 | 60 | 60 | 82 | 73 | 63 | 63 |
| additive (wt %) | | 14 | 9 | 9 | 18 | 14 | 14 | 14 |
| components of additive (wt %) | X-12-1050 | 27 | 0.4 | 0.4 | 27 | 27 | 27 | 27 |
| | Alink | 40 | 0.6 | 0.6 | 40 | 40 | 40 | 40 |
| | AD124 | — | — | — | — | — | — | — |

TABLE 3-continued examples 14 to 16 & comparative examples 1 to 4.

| solid content | | example 14 | example 15 | example 16 | comparative example 1 | comparative example 2 | comparative example 3 | comparative example 4 |
|---|---|---|---|---|---|---|---|---|
| | N740 | 33 | — | — | — | — | — | — |
| | TMOM-BP | — | — | — | — | — | — | — |
| | HMMM | — | — | — | 33 | 33 | 33 | 33 |
| solvent resistance | | ◎ | ◎ | ○ | X | ○ | ◎ | ◎ |
| adhesion ability | | 0.647 | 1.196 | 1.037 | 0.281 | 0.398 | 0.271 | 0.279 |

TABLE 4 examples 17 to 19.

| solid content | | example 17 | example 18 | example 19 |
|---|---|---|---|---|
| components of resin (wt %) | OXMA | 25 | 25 | 25 |
| | GMA | — | — | — |
| | ACMO | 5 | 5 | — |
| | HEMA | 30 | 30 | 30 |
| | FA513M | 25 | 25 | 25 |
| | EM2105 | 15 | 15 | 15 |
| | EM50 | — | — | — |
| | DMAEMA | — | — | 5 |
| resin (wt %) | | 24 | 24 | 23 |
| light-shielding material (wt %) | | 66 | 66 | 63 |
| additive (wt %) | | 10 | 10 | 14 |
| components of additive (wt %) | X-12-1050 | 55 | — | 27 |
| | Alink | — | — | 40 |
| | AD124 | — | 55 | — |
| | N740 | — | — | — |
| | TMOM-BP | — | — | — |
| | HMMM | 45 | 45 | 33 |
| solvent resistance | | ◎ | ◎ | ○ |
| adhesion ability | | 0.829 | 0.572 | 1.64 |

From the above examples and comparative examples 1 to 4, it can be known that the excellent solvent resistance or adhesion ability cannot be realized if the resin having the at least one nitrogen-containing organic group selected from the group consisting of tertiary amino groups and secondary amino groups, the organic group having the cyclic ether group, and the organic group having the hydroxyl group is not included. From examples 7 and 8, it can be known that the composition containing the resin having two kinds of cyclic ether groups has a better adhesion ability. From examples 11, 17, and 18, it can be known that the composition containing the siloxane compound having an epoxy group or an isocyanate group has a good adhesion ability, and the siloxane compound having a vinyl group has a better adhesion ability.

[Fields of Application]

In addition to an application in the field of semiconductor packaging, any support material or material that requires to undergo one or more processes by a temporary carrier and at last to be separated from the carrier by laser, belongs to the scope of the laser-debondable composition and the laminate of the present disclosure. For example, soft support materials or fabrication of solar cells.

Although the present disclosure has been disclosed in the above embodiments, it is not intended to limit the present disclosure. For a person of ordinary skill in the art, various changes and modifications can be made without departing from the spirit and scope of the present disclosure that is intended to be limited only by the appended claims.

Elements in the drawings are designated by reference numerals listed below.

S1: step 1; S2: step 2; S3: step 3; S4: step 4; 1: support material; 2: film; 3: processing member.

What is claimed is:

1. A laser-debondable composition, comprising an acrylic resin, a light-shielding material, an additive, and a solvent; wherein the acrylic resin comprises an organic group having a cyclic ether group, an organic group having a hydroxyl group, and at least one nitrogen-containing organic group selected from a group consisting of tertiary amino groups and secondary amino groups, and the additive comprises at least one adhesion promoter; wherein in the acrylic resin, a mass ratio of the organic group having the cyclic ether group to the at least one nitrogen-containing organic group ranges from 1:0.015 to 1:10, a mass ratio of the organic group having the cyclic ether group to the organic group having the hydroxyl group ranges from 1:0.015 to 1:25, and a mass ratio of the at least one nitrogen-containing organic group to the organic group having the hydroxyl group ranges from 1:0.02 to 1:60.

2. The laser-debondable composition according to claim 1, wherein an acid value of the acrylic resin is less than 4 mg/g.

3. The laser-debondable composition according to claim 1, wherein the adhesion promoter comprises a siloxane compound or silane compound having a vinyl group, an epoxy group, an amino group, an anhydride, a thiol group, or an isocyanate group.

4. The laser-debondable composition according to claim 1, wherein the at least one nitrogen-containing organic group selected from the group consisting of tertiary amino groups and secondary amino groups is at least one selected from a group consisting of 2-(hydrocarbyl)amino hydrocarbyl ester groups, dihydrocarbyl amino hydrocarbyl ester groups, urethane groups, pyridine groups, piperazine groups, and morpholine groups, wherein each —CH$_2$— in hydrocarbon groups is optionally replaced with one of —NH—, —O—, or —S—, with proviso that when at least two of —CH$_2$— are replaced, at least two of —NH—, —O—, or —S— are not bonded to each other directly.

5. The laser-debondable composition according to claim 1, wherein the acrylic resin comprises at least two cyclic ether groups having rings with different carbon numbers.

6. The laser-debondable composition according to claim 1, wherein the cyclic ether group is an oxetanyl group, a glycidyl group, or a combination thereof.

7. The laser-debondable composition according to claim 1, wherein the light-shielding material comprises carbon black, titanium black, titanium oxide, iron oxide, titanium nitride, silica fume, organic pigments, inorganic pigments, or dyes.

8. The laser-debondable composition according to claim 1, wherein the additive further comprises a cross-linking agent.

9. A laminate, comprising a support material and a film formed on the support material using the laser-debondable composition of claim 1.

10. A composite film, comprising a debondable support film and a temporary adhesive film formed using the laser-debondable composition of claim 1, wherein the temporary adhesive film is disposed on one surface of the debondable support film.

* * * * *